United States Patent [19]

Phelps, III et al.

[11] Patent Number: 5,886,875

[45] Date of Patent: Mar. 23, 1999

[54] APPARATUS USING A CIRCUIT BOARD HAVING A FRANGIBLE PORTION APPARATUS

[75] Inventors: William C. Phelps, III, Lawrenceville; John M. Heffernan, Suwanee; Habib Amirzadeh, Norcross, all of Ga.

[73] Assignee: Motorola, Inc., Schaumburg, Ill.

[21] Appl. No.: 581,860

[22] Filed: Jan. 2, 1996

[51] Int. Cl.[6] .................................................. H05K 5/00
[52] U.S. Cl. ........................ 361/752; 361/741; 361/742; 361/801; 283/81; 40/299.01; 40/630
[58] Field of Search .................................. 361/736, 737, 361/740, 741, 742, 745, 747–749, 752–754, 756, 758–759, 770, 801–803, 820; 283/81, 100, 101; 40/299, 630, 638; 439/491

[56] References Cited

U.S. PATENT DOCUMENTS 5,436,800  7/1995  Maruska et al. ........................ 361/752

*Primary Examiner*—Leo P. Picard
*Assistant Examiner*—Phuong T. Vu
*Attorney, Agent, or Firm*—Felipe J. Farley

[57] ABSTRACT

A circuit board (10) has a frangible portion (12) for carrying information relating to the circuitry carried on the circuit board. The information is carried in the form of a label (18) or barcode, and identifies the version of the circuitry so that during manufacturing, and later during repair, the circuit can be correctly identified. The frangible portion is broken from the circuit board, but kept with the circuit board. In one embodiment, an adhesive label retains the frangible portion.

1 Claim, 4 Drawing Sheets

APPARATUS USING A CIRCUIT BOARD HAVING A FRANGIBLE PORTION APPARATUS

TECHNICAL FIELD

This invention relates in general to circuit boards for electrical devices, and more particularly to circuits boards which have information disposed thereon.

BACKGROUND

In the manufacture of electrical apparatus, it is often the case that a common platform circuit design is used across a family of devices. Many times the difference is only apparent in instruction code embedded in the devices controller. Two devices having only a difference of instruction code, while physically identical, may operate substantially different. Manufacturers have devised several means of labeling to distinguish one member of a device family from another. Labeling is important for a number of reasons. For one, it lets the manufacturing operation know what version of product is currently being made. Since the products look similar, if not identical, it is important to keep the different versions separated so that customers that order one type of product don't receive something else. Also, when the device is in need of repair, a technician needs some way of knowing what particular product or version of a product he or she is repairing. Labeling is currently performed by one of two primary methods; labeling the housing of the device, placing a label on the circuit board, or a combination of the two. However, there are problems associated with each of these approaches.

In labeling the housing of the device, it is assumed that the circuit or circuit board that is eventually assembled into the housing is the correct one. When the assembly operation is small, and only one or two versions of a product are assembled, this approach works well. However, in high volume, multi-product manufacturing, the chance of a miss-labeling occurring rises dramatically.

By placing a label on the circuit board, the chance of placing an incorrect label on the device drops significantly since the label is put on when the board is assembled. Consequently, the label travels with the board throughout assembly, and it is always clear upon inspection what particular product the circuit board is intended for. However, as devices are packaged to minimize size, setting aside a portion of a circuit board for a label can be costly. It causes the size of the product to be larger, which means fewer products will fit in a given space for shipping. At the very least, placing a label on the circuit board takes up an area that would otherwise be used for circuit components.

Accordingly, it would be advantageous to label a circuit board when it is assembled, and not increase the board size substantially beyond that required only for the circuit components. Therefore there is a need for a labeling method that provides the requisite information with the circuit board, yet requires no additional board area.

DETAILED DESCRIPTION OF THE PREFERRED EMBODIMENT

Figure 1:
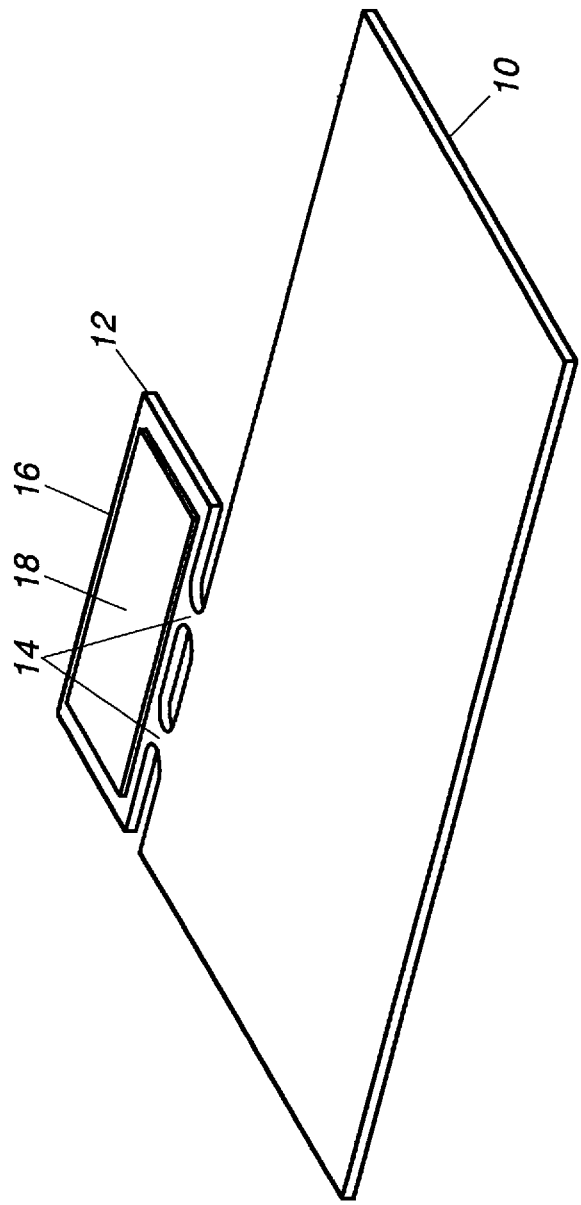
FIG. 1 is a perspective view of a circuit board in accordance with the invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, a perspective view of a circuit board 10 in accordance with the invention. The circuit board is used to carry circuit components such as resistors, capacitors, transformers, integrated circuit chips, etc., as is typical in electrical apparatus. The circuit board is made of a rigid material, such as FR4, and may be a multilayered board. Although shown here as substantially rectangular, it is typical that circuit boards are both irregularly shaped to fit into the housing of a particular product, and panelized. By panelized it is meant that boards are manufactured as part of a panel of circuit board material, each panel having a plurality of such irregularly shaped boards formed therein. When the boards are irregularly shaped, there is often large areas of the panel that are unused. For example, if the boards were formed having a semi-circular shape, there would be considerable area of the panel left since panels are virtually always square or rectangular. After assembling the circuitry onto the circuit boards, the boards are removed from the panel, leaving the rest of the panel for disposal.

In accordance with the invention, a frangible portion 12 of the circuit board is formed breakably attached to the circuit board. By this it is meant that the frangible portion 12 can be easily broken away from the circuit board 10. The preferred way of providing the break away action is to use the same method of making the circuit board able breakable from it's panel. Typically this is done by routing through the panel and around the outline of the board, leaving several small bridge portions between the circuit board and the panel. As shown here, there are two such bridge portions 14 connecting the frangible portion 12 with the circuit board 10. By moving the outside edge 16 of the frangible portion up or down while holding the circuit board, the bridge portions 14 will break, thus separating the frangible portion from the circuit board. An alternative method of making the frangible portion is to contiguously form the circuit board and frangible portion, then score along the desired break line to weaken that board. Then, the frangible portion is separated from the board along the score line. Both of these methods are common in the art, although the routing method is preferred.

Prior to breaking the frangible portion from the board, a label means 18 is placed on the frangible portion. The label means carries the pertinent manufacturing information, and is either an adhesive label, or the information is simply printed on the frangible portion. The information may be either in an alphanumeric form, or some code symbols such as a barcode. When the label means is an adhesive label, it is affixed to at least the frangible portion 12, and a portion of the adhesive label may be disposed on a portion of the circuit board, as is discussed hereinbelow.

Figure 2:
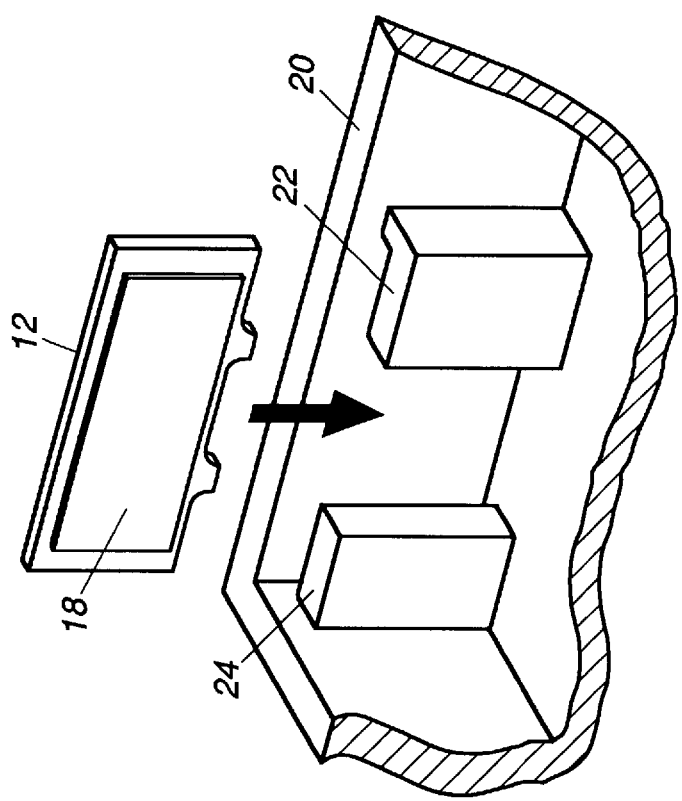
FIG. 2 is a perspective view of a portion of a device in accordance with one embodiment of the invention.

Referring now to FIG. 2, a perspective view of a portion of a device in accordance with one embodiment of the invention. There is illustrated therein a section of a first housing portion 20 having a means for receiving the frangible portion 12. The preferred means for receiving comprises a first retaining wall 22 and a second retaining wall 24, which depend from the first housing portion. The first and second retaining walls form a slot that the frangible portion slides into. As will be described below, a second housing portion has features that retain the frangible portion in the slot when assembled to the first housing portion.

Figure 3:
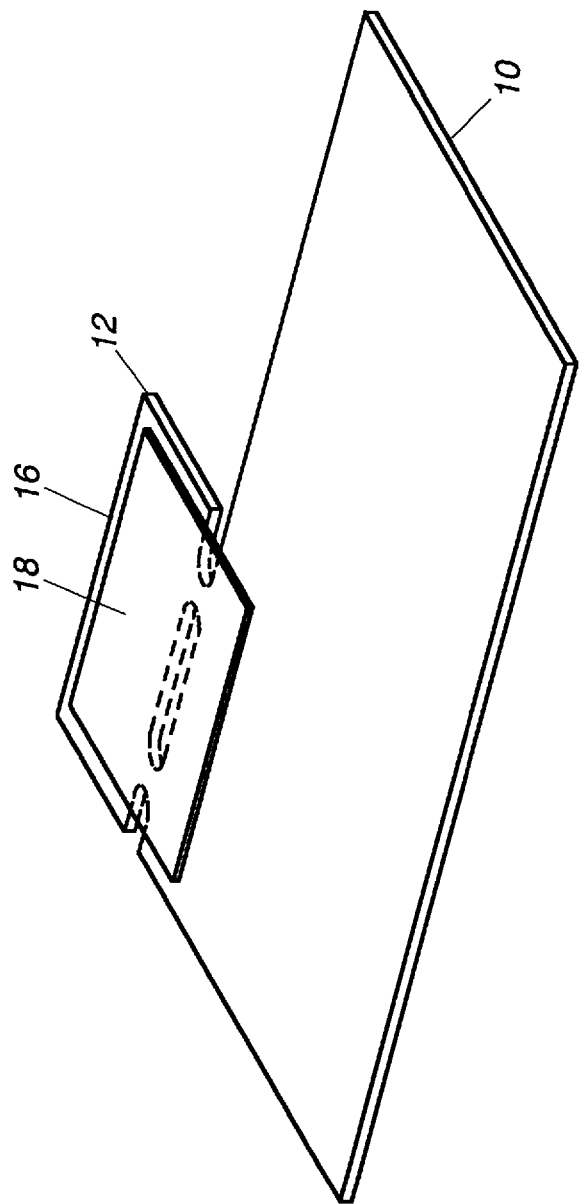
FIG. 3 is a perspective view of circuit board in accordance with the invention.

A second embodiment is illustrated in FIG. 3. Referring now to FIG. 3, there is shown therein, similar to FIG. 1, a circuit board 10 with a frangible portion 12. Here the label 18 is an adhesive label, and it is affixed to both the frangible portion, and a portion of the circuit board, thus joining them together. This allows the frangible portion to be broken off so that it can be raised upright from the board, and helps to ensures that it is not lost.

Figure 4:
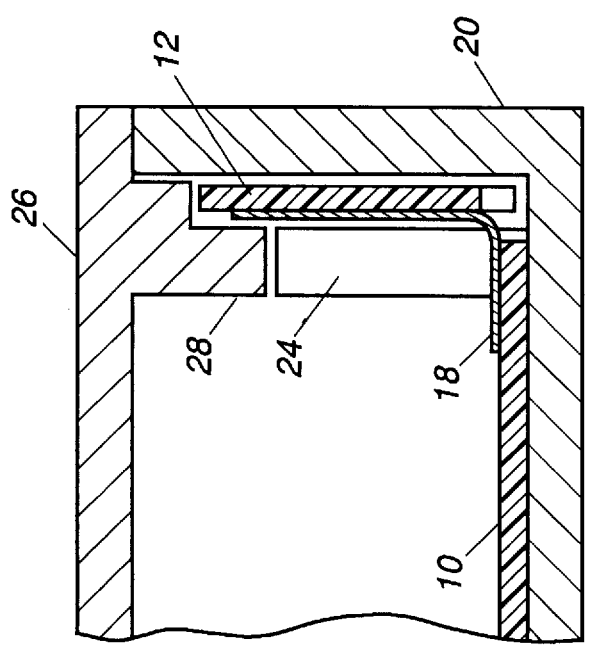
FIG. 4 is a cut-away side view of an assembled device in accordance with one embodiment of the invention.

FIG. 4 illustrates how the invention is practiced. Referring now to FIG. 4, a cut-away side view of a section of an assembled device in accordance with the invention, there is shown therein a first housing portion 20 having a second retaining wall 24, a circuit board 10 is retained in the first housing portion separately from a frangible portion 12, and an adhesive label 18 is affixed to the frangible portion 12, and the circuit board 10. The label holds the frangible portion to the circuit board during assembly. This is similar to the structure shown in FIG. 2, except here the first retaining wall can't be seen. Additionally, as a means for retaining the frangible portion, a second housing portion 26 has a ledge 28 which abuts the frangible portion when the second housing portion is assembled to the first housing portion.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A labeled circuit board comprising:

(a) a first circuit board;

(b) a second substantially smaller circuit board having a first label separated from the first circuit board;

(c) a housing; and (d) an adhesive label;

wherein the first label contains information about the first circuit board, and a housing holds the first circuit board in proximity with the second circuit board;

and the adhesive label connects the first circuit board to the second circuit board.

* * * * *